United States Patent [19]

McConnell et al.

[11] Patent Number: 6,165,912

[45] Date of Patent: Dec. 26, 2000

[54] ELECTROLESS METAL DEPOSITION OF ELECTRONIC COMPONENTS IN AN ENCLOSABLE VESSEL

[75] Inventors: Christopher F. McConnell, Berwyn; Steven Verhaverbeke, Radnor, both of Pa.

[73] Assignee: CFMT, Inc., Wilmington, Del.

[21] Appl. No.: 09/395,398

[22] Filed: Sep. 14, 1999

Related U.S. Application Data

[60] Provisional application No. 60/100,870, Sep. 17, 1998.

[51] Int. Cl.$^7$ .............................. H01L 21/31; B05D 1/18; B05D 3/10

[52] U.S. Cl. ........................... 438/758; 438/678; 427/98; 427/123; 427/125; 427/601; 427/304; 427/305; 427/347; 427/437; 427/438; 427/443.1; 427/383.1

[58] Field of Search ..................................... 427/601, 304, 427/305, 307, 347, 437, 438, 443.1, 383.7, 98, 123, 125; 438/678, 758

[56] References Cited

U.S. PATENT DOCUMENTS

| | | | |
|---|---|---|---|
| 3,801,368 | 4/1974 | Fusayama et al. | 117/239 |
| 4,152,467 | 5/1979 | Alpaugh et al. | 427/8 |
| 4,466,864 | 8/1984 | Bacon et al. | 204/15 |
| 4,574,095 | 3/1986 | Baum et al. | 427/53.1 |
| 4,577,650 | 3/1986 | McConnell | 134/59 |
| 4,633,893 | 1/1987 | McConnell et al. | 134/95 |
| 4,738,272 | 4/1988 | McConnell | 134/59 |
| 4,778,532 | 10/1988 | McConnell et al. | 134/10 |
| 4,795,497 | 1/1989 | McConnell et al. | 134/18 |
| 4,885,056 | 12/1989 | Hall et al. | 156/662 |
| 4,894,260 | 1/1990 | Kumasaka et al. | 427/241 |
| 4,899,767 | 2/1990 | McConnell et al. | 134/56 R |

(List continued on next page.)

FOREIGN PATENT DOCUMENTS

WO 98/03273 1/1998 WIPO .
WO 99/30355 6/1999 WIPO .

OTHER PUBLICATIONS

"Full-Flow™ Wet Processing" brochure, 1993, CFM Technologies, Inc., West Chester, PA.

Gale et al., "Experimental Study of Ultrasonic and Megasonic Particle Removal", Precision Cleaning, Apr. 1994, vol. 2, No. 4, 32 pages.

Kern, W. et al., "Chemical Etching", *Thin Film Processes*, Vosser, J.L. (ed.), Academic Press, NY, 1978, vol. 1, pp. 403–447 and 452–481.

Kirk–Othmer Concise Encylcopedia of Chemical Technology, John Wiley & Sons, NY, 1985, 1142–1144.

Palmans, R. et al., "Feasibility Study of Electroless Copper Deposition for VLSI," *Applied Surface Science*, 1991, 53, 345–352.

Palmans, R. et al., "Development of an Electroless Copper Deposition Bath for Via Fill Applications on Tin Seed Layers," *Conference Proceedings ULSI-X Materials Research Society*, 1995, 87–94.

(List continued on next page.)

*Primary Examiner*—Timothy Meeks
*Assistant Examiner*—Michael Barr
*Attorney, Agent, or Firm*—Woodcock Washburn Kurtz Mackiewicz & Norris LLP

[57] ABSTRACT

The present invention provides methods of electrolessly depositing metal onto the surfaces of electronic components using an enclosable single vessel. The methods of the present invention include contacting the electronic components with an activation solution followed by contacting the electronic components with a metal deposition solution. In a preferred embodiment of the present invention, the oxygen levels in the activation solution and metal deposition solution are controlled in a manner for improved processing results. In another preferred embodiment of the present invention, the activation and metal deposition solutions are used one time without reuse.

20 Claims, 1 Drawing Sheet

U.S. PATENT DOCUMENTS

| | | | |
|---|---|---|---|
| 4,911,761 | 3/1990 | McConnell et al. | 134/11 |
| 4,917,123 | 4/1990 | McConnell et al. | 134/95 |
| 4,967,690 | 11/1990 | Fey et al. | 118/429 |
| 4,984,597 | 1/1991 | McConnell et al. | 134/95 |
| 5,071,518 | 12/1991 | Pan | 205/122 |
| 5,075,259 | 12/1991 | Moran | 437/230 |
| 5,171,709 | 12/1992 | Donelon et al. | 437/173 |
| 5,294,572 | 3/1994 | Granneman et al. | 437/225 |
| 5,308,796 | 5/1994 | Feldman et al. | 437/200 |
| 5,358,907 | 10/1994 | Wong | 437/230 |
| 5,383,484 | 1/1995 | Thomas et al. | 134/184 |
| 5,424,252 | 6/1995 | Morishita | 437/230 |
| 5,544,773 | 8/1996 | Haruta et al. | 216/13 |
| 5,569,330 | 10/1996 | Schild et al. | 134/1 |
| 5,571,337 | 11/1996 | Mohindra et al. | 134/7 |
| 5,648,125 | 7/1997 | Cane | 427/534 |
| 5,660,706 | 8/1997 | Zhao et al. | 205/123 |
| 5,743,280 | 4/1998 | Han | 134/56 R |
| 5,830,805 | 11/1998 | Shacham-Diamond et al. | 438/678 |
| 5,865,894 | 2/1999 | Reynolds | 118/429 |
| 5,882,498 | 3/1999 | Dubin et al. | 205/261 |

OTHER PUBLICATIONS

Ting, C.H. et al., "Selective Electroless Metal Deposition for via Hole Filling in VLSI Multilevel Interconnection Structures," *J. Electrochem. Soc.*, 1989, 136(2), 462–466.

Verhaverbeke, S. et al., "Scientific Rinsing and Drying on Macro and Microscale," in Semiconductor Pure Water and Chemicals Conference 1996, Balazs, m.K. (ed.), Santa Clara, CA Mar. 4–7, 1996, 14 pages.

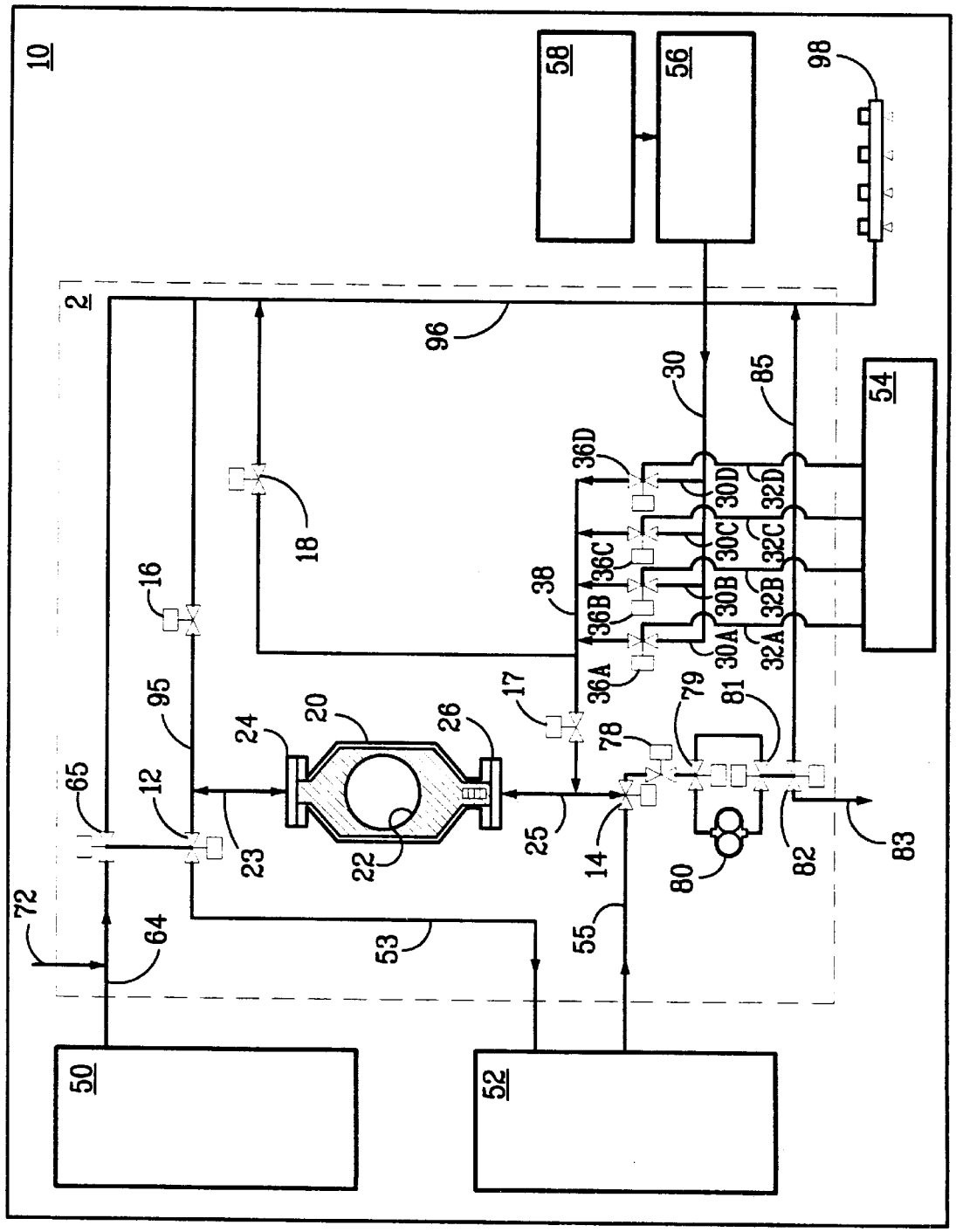

ELECTROLESS METAL DEPOSITION OF ELECTRONIC COMPONENTS IN AN ENCLOSABLE VESSEL

CROSS-REFERENCE TO RELATED APPLICATIONS

This application claims the benefit of U.S. Provisional Application Ser. No. 60/100,870, filed on Sep. 17, 1998, the disclosure of which is hereby incorporated by reference in its entirety.

FIELD OF THE INVENTION

The present invention relates to methods of electrolessly depositing a metal onto electronic components using an enclosable vessel. More particularly, the present invention relates to wet processing methods for activating the surfaces of electronic components and depositing metal electrolessly on the electronic components in an enclosable single vessel.

BACKGROUND OF THE INVENTION

Currently, there are various techniques being used in the electronic component industry for depositing or plating metal (e.g., copper, cobalt, gold, and nickel) onto the surfaces of electronic components. Such methods include, for example, chemical vapor deposition, metal sputtering, electroplating, and electroless metal deposition.

Electroless metal deposition has become more popular in recent years and involves depositing metal onto the surfaces of electronic components in the absence of an electrical current (i.e., electrolessly). Examples of where electroless metal deposition has been used in the electronic assembly industry are in the deposition of copper on printed circuit boards. Also, in semiconductors, electroless deposition is used to deposit nickel on bonding packs, and in multichip modules, electroless deposition is used to deposit copper interconnects.

Electroless deposition of metal is typically carried out by first "activating" the surface of an electronic component by seeding or depositing a substance that will promote metal deposition onto the electronic component surface. However, it is possible that seeding may not be necessary. For example, on a substrate containing cobalt, nickel, rhodium, or palladium, seeding may not be necessary to promote metal deposition. Seeding, when desired, can be accomplished for example through immersing the electronic component in a solution containing a seeding agent. Following activation, the electronic component is typically immersed in a solution that contains metal ions and a reducing agent. The reducing agent provides a source of electrons for the metal ions, so that metal ions near or at the surfaces of the electronic components are reduced to metal and plated out onto the electronic components.

There are various metals that can be deposited electrolessly onto an electronic component including for example copper, nickel, cobalt, gold, silver, palladium, platinum, rhodium, iron, aluminum, tantalum, titanium nitride, titanium, tungsten, tantalum nitride, tungsten nitride, cobalt tungsten phosphorous, or combinations thereof. A metal that has been of particular interest recently is copper.

The electroless deposition of copper is most commonly carried out by seeding or activating the surface of the electronic component by briefly immersing the electronic component in a solution containing palladium. The palladium upon contact with the electronic component will deposit on conductive metallic surfaces such as aluminum, titanium nitride, tantalum nitride, tungsten and copper, while leaving oxide containing surfaces unseeded.

Following seeding, electroless copper deposition typically includes a two-step reaction; reduction of the seeded conductive surface followed by plating of ionized copper onto the reduced conductive surface. A typical reductant for the electroless deposition of copper is formaldehyde ($CH_2O$). In this case, the first step is given by:

$$CH_2O + 2OH^- \rightarrow HCOO^- + H_{ad} + H_2O + e^- \qquad \text{(Eqn. 1)}$$

Where $H_{ad}$ represents hydrogen adsorbed onto the surface. The adsorbed hydrogen can further react in one of two manners:

$$2H_{ad} \rightarrow H_2 \qquad \text{(Eqn. 2) or}$$

$$H_{ad} + OH^- \rightarrow H_2O + e^- \qquad \text{(Eqn. 3)}$$

It is preferable to have water and an additional electron formed (i.e., Eqn. 3), as the formation of hydrogen gas (Eqn. 2) can lead to bubbles, and subsequent uneven metallic deposition. Thus, reaction conditions favoring Equation 3, such as high pH and slow metal deposition rates are preferred. Once the surface of the electronic component is reduced, if ionic copper (copper in an oxidized state) is present near or at the surface, it will plate out on the surface ($Cu^{++}/Cu^+$ is reduced to $Cu^0$ on conductive surfaces which supply the electrons):

$$Cu^{++} + 2e^- \rightarrow Cu^0 \qquad \text{(Eqn. 4)}$$

$$Cu^+ + e^- \rightarrow Cu^0 \qquad \text{(Eqn. 5)}$$

Electroless metal deposition, when performed in a wet processing system, has typically been performed in a system containing multiple open baths (e.g., a wet bench). The use of a multiple open bath system has many disadvantages. For example, oxygen has an impact on electroless metal deposition. For example, during activation, oxygen hinders seeding and can also react with the seeding agent once deposited to make the seeding agent ineffective during metal deposition. However, during the metal deposition step, oxygen can prevent degradation of the metal deposition solution, and can also slow the rate of metal deposition for better control of the process. In an open multiple bath system, it is very difficult to control oxygen levels since the baths are open to the atmosphere, and the electronic components are transferred from one bath to another. Additionally, since the bath solutions are changed infrequently, batch to batch variations in metal deposition are frequently encountered due to decomposition or fluctuating concentrations of reagents in the solutions.

U.S. Pat. No. 5,830,805 to Shacham-Diamand et al. (hereinafter "the '805 patent") proposes a solution to the problem of oxygen exposure found in open bath systems. The '805 patent discloses an apparatus and method of electroless deposition that includes processing wafers in a single sealed process chamber where a variety of fluids can be fed sequentially into the process chamber. Despite the advantages of using a sealed process chamber, the apparatus and method disclosed in the '805 patent also has disadvantages. For example, the '805 patent discloses minimizing the level of oxygen (e.g., in the absence of air) in all processing steps, despite the advantages of oxygen in certain steps in electroless metal deposition.

Additionally, the apparatus and method disclosed in the '805 patent reuses and recirculates its solutions. However, research has shown, for example, that fresh activator solution leads to significantly improved metal deposition rates in comparison to re-used activator solution. See R. Palmans, K. Maex, Feasibility Study of Electroless Copper Deposition for VLSI, 53 Applied Surface Science (1991), pp.345–352, incorporated herein by reference. Additionally, changes in concentration of solutions through reuse can lead to inconsistent processing results as with multiple open bath systems.

The present invention seeks overcome these problems, for example, by providing methods of electroless metal deposition where the activation solution and metal depositions are preferably used one time, without reuse. The present invention also provides, for example, methods of controlling oxygen levels in the solutions during electroless metal deposition based on the type of solution being contacted with the electronic components.

SUMMARY OF THE INVENTION

The present invention provides methods of electrolessly depositing a metal onto an electronic component in an enclosable single vessel. The methods of the present invention are advantageous in that the activation and metal deposition solutions are preferably contacted with electronic components only one time, without reuse. Additionally, the methods of the present invention preferably provide for controlling the level of oxygen in solutions where such control is needed for consistent processing results.

In one embodiment, the method of the present invention includes loading a plurality of electronic components in an enclosable single vessel and forming an activation solution containing at least one seeding agent, where the activation solution is substantially free of oxygen. The activation solution is then fed into the vessel, contacted with the electronic components in the vessel for a first contact time, and removed from the vessel. In addition to contacting the electronic components with the activation solution, the present invention includes forming a metal deposition solution containing at least one source of metal ions, at least one reducing agent, and oxygen. The metal deposition solution formed is fed into the vessel and contacted with the electronic components in the vessel for a second contact time to deposit metal onto the surfaces of the electronic components. During at least a portion of the second contact time, the electronic components are also exposed to sonic energy. Following contact with the metal deposition solution, the metal deposition solution is removed from the vessel.

In a preferred embodiment of the present invention, both the activation solution and the metal deposition solution are used only one time. Additionally, it is preferred that the activation solution and metal deposition solution are prepared in-line for more consistent processing results.

The methods of the present invention also contemplate that an activation step to seed the surface of the electronic component may not be necessary if metal can be deposited electrolessly without seeding.

BRIEF DESCRIPTION OF THE DRAWINGS

The FIGURE is a schematic representation of an enclosable single vessel system useful in the method of the present invention.

DETAILED DESCRIPTION OF THE INVENTION

The present invention provides methods of electrolessly depositing metal onto the surfaces of electronic components using wet processing techniques. By "electroless" or "electrolessly" as used herein, it is meant that at least one metal is deposited onto the surface of an electronic component without the use of an electrical current. By "wet processing," it is meant that the electronic components are contacted with one or more liquids (hereinafter referred to as "process liquids") to process the electronic components in a desired manner. For example, in the present invention, the electronic components are preferably contacted with at least one activation solution and at least one metal deposition solution. It may however be desirable to contact the electronic components with other process liquids such as etching, cleaning, or rinsing solutions. Wet processing may also include steps where the electronic components are contacted with other fluids, such as a gas, a vapor, or combinations thereof. As used herein, the term "fluid" includes liquids, gases, liquids in their vapor phases, or any combination thereof.

The methods of the present invention are useful for depositing metal on any electronic component that has at least a portion of a surface that can be prepared or is already prepared for electroless metal deposition. Examples of surfaces of electronic components suitable for electroless metal deposition include metallic surfaces such as aluminum, titanium nitride, tantalum nitride, tungsten, copper, silicon, cobalt, nickel, rhodium, palladium or combinations thereof. The presence of oxides, such as silicon dioxide, generally inhibit the activation and metal deposition steps and is therefore undesirable in locations of an electronic component where it is desired to deposit metal electrolessly. Electronic components useful in the methods of the present invention include electronic component precursors such as semiconductor wafers, flat panels, and other components used in the manufacture of electronic components (i.e., integrated circuits); CD ROM disks; hard drive memory disks; multichip modules; or combinations thereof.

Any metal capable of being deposited electrolessly may be used in the methods of the present invention. Metals that can be electrolessly deposited include for example copper, nickel, cobalt, gold, silver, palladium, platinum, rhodium, iron, aluminum, tantalum, titanium nitride, titanium, tungsten, tantalum nitride, tungsten nitride, cobalt tungsten phosphorous, or combinations thereof, and more preferably copper, nickel, cobalt, gold, or combinations thereof. In a most preferred embodiment, copper is electrolessly deposited.

The methods of the present invention are particularly useful for depositing metal onto the surfaces of electronic components in such applications as filling interconnects (e.g., plugs and vias) between layers, and forming contacts. Preferred applications include electrolessly depositing a preliminary layer of copper to enable the subsequent electrolytic plating of copper.

The methods of the present invention have numerous advantages. For example, the activation and metal deposition steps, as described in more detail hereinafter, are performed in an enclosable single vessel. By "enclosable single vessel," it is meant that the vessel is capable of being closed to the atmosphere and that the activation and metal deposition steps are performed in the same vessel without removal of the electronic components. Using an enclosable single vessel allows one to control the level of oxygen that the electronic components are exposed to throughout the entire wet processing procedure. Such control in oxygen levels can lead to more uniform results within a single batch and between batches. Additionally, as further control and maintenance of oxygen levels, the system containing the enclosable single vessel preferably contains a gas adjusting unit to either add or remove oxygen from the process liquids that are contacted with the electronic components as described in further detail hereinafter.

Another advantage of the methods of the present invention is that the activation solution and metal deposition solution are preferably used one time and discarded, as opposed to being reused with a different batch of electronic components. Preferably also, the activation solution and metal deposition solution are contacted with the electronic components in a single pass (without recirculation) as opposed to being continuously recirculated with the same batch of wafers. The one time and single pass use of the activation and metal deposition solution results in for example reduced contamination of the electronic components and more uniform metal deposition within the same batch or between different batches of electronic components.

In the methods of the present invention, electronic components are loaded into an enclosable single vessel. The electronic components, prior to any activation step, may optionally be pretreated according to any desired wet processing technique. For example, it may be desired to clean or etch the electronic components to remove native oxides on the surfaces of the electronic components. Following any optional pretreatment step, an activation solution is formed, and is fed into the vessel. The activation solution is contacted with the electronic components in the vessel for a first contact time and removed from the vessel. During or at some point after removal of the activation solution, a metal deposition solution is fed into the vessel. The metal deposition solution is contacted with the electronic components for a second contact time while the electronic components are exposed to sonic energy for at least a portion of the second contact time. Following removal of the metal deposition solution, the electronic components may be treated in any further manner as desired prior to being removed from the vessel.

As previously described herein, it is also contemplated that the methods of the resent invention may, in certain circumstances, be conducted without contacting the electronic components with an activation solution. For example, contact with an activation solution may not be necessary when the surfaces of the electronic components contain cobalt, nickel, rhodium, palladium, or combinations thereof, as it is believed metal will deposit electrolessly on these types of surfaces without the presence of a seeding agent.

As mentioned previously, the activation solution and metal deposition solution are preferably used one time, in a single pass, and are not reused or recirculated. Consequently, for economic reasons, it is desirable to reduce the volume of activation solution and metal deposition solution needed per electronic component. In a preferred embodiment of the present invention, the electronic components are loaded into the vessel at a spacing ranging from about ¼ pitch to about ½ pitch. The term "pitch" as used herein refers to the standard spacing between electronic components established by SEMI, located in Mountain View, Calif. This standard spacing or pitch is typically different for electronic components of different sizes. Thus, for example, to determine the spacing of electronic components loaded into the vessel at ¼ pitch, one would determine the standard pitch for the type of electronic components loaded into the vessel, and would then multiply the standard pitch by 0.25 (i.e., ¼) to obtain the ¼ pitch spacing. In a preferred embodiment of the present invention, the electronic components are spaced at ½, ⅓, or ¼ pitch to reduce the volume of process liquid needed per electronic component. Further detail of pitch spacings suitable in the methods of the present invention are disclosed in U.S. application Ser. No. 09/304,587, filed May 4, 1999 which is hereby incorporated by reference in its entirety.

After loading the electronic components in the vessel, the electronic components are contacted with an activation solution for a first contact time. The activation solution that the electronic components are contacted with is any liquid that contains a seeding agent that deposits on the electronic component and that will facilitate the deposition of metal onto the surfaces of the electronic component. Preferably, the activation solution is aqueous based (i.e., containing water as a solvent for the other components), but may also contain minor amounts of organic solvents such as ethylene glycol, propylene carbonate, or methanol, or combinations thereof. One skilled in the art will recognize that there are various suitable seeding agents that can be used, and the selection of a seeding agent will depend on such variables as the composition of the surfaces of the electronic components, and the metal or metals that will be electrolessly deposited. Suitable seeding agents include for example ions, elements, or compounds containing palladium, gold, or combinations thereof. For the electroless deposition of copper, nickel, cobalt, palladium, gold, platinum, silver, or alloys containing phosphorous and/or boron, or combinations thereof, preferably elemental palladium, or ions or compounds containing palladium are used.

The desired concentration of the seeding agent in the activation solution will depend on such factors as the seeding agent selected, the desired processing conditions (such as temperature, contact time) and the composition of the electronic components to be processed. Preferably, the concentration is such that less than a monolayer of seeding agent (such as palladium) is deposited, and more preferably $10^{12}$ to $10^{14}$ atoms or molecules of seeding agent are deposited per $cm^2$ of electronic component. Furthermore, it is desirable to have a high enough concentration of seeding agent so that the contact time with the activation solution is minimized. Typically, a preferred concentration of seeding agent in the activation solution is from about 0.0001 moles/l (M) to about 0.01 M, more preferably from about 0.0003 M to about 0.007 M, and most preferably from about 0.0005 M to about 0.004 M.

In addition to the seeding agent, other components may be present in the activation solution. For example, compounds that are effective in removing or inhibiting the formation of unwanted oxides may be present, such as hydrochloric acid, or etching agents such as hydrofluoric acid. It may also be desired to include weak acids such as acetic acid. In a preferred embodiment of the present invention, the activation solution is an aqueous solution containing a palladium compound (such a palladium chloride) or palladium ions, hydrofluoric acid, hydrochloric acid, and acetic acid. Preferred compositions for the activation solution that are particularly useful for the electroless deposition of copper are shown in Table 1. See also for example, C. H. Ting et al., *Selective Electroless Metal Deposition for via Hole Filling in VLSI Multilevel Interconnection Structures*, J. Electrochem. Soc., Vol. 136, No. 2, February 1989, pp. 462–466, incorporated herein by reference in its entirety.

TABLE 1

Preferred Compositions of Activation Solution

| Component in Activation Solution | Amount |
| --- | --- |
| $PdCl_2$ | 0.05 g/l to 0.8 g/l |
| HCl | 0.1 ml to 2 ml |
| $CH_3COOH$ | 100 ml to 900 ml |
| HF (50:1 volume, $H_2O$:HF) | 50 ml to 500 ml |
| $H_2O$ | 50 ml to 500 ml |

For example, a typical activation solution may preferably contain about 0.2 g/l $PdCl_2$, about 1 ml hydrochloric acid, about 500 ml glacial acetic acid, about 250 ml of 50:1 volume ratio of water:hydrofluoric acid; and about 245 ml of deionized water.

The activation solution may also contain other additives such as surfactants, anti-corrosion agents, or any other conventional additive typically added to activation solutions. Preferably, these other additives are present in the activation solution in an amount of less than about 5.0 percent by volume and more preferably less than about 1.0 percent by volume. Examples of surfactants that may be used include anionic, nonionic, cationic and amphoteric surfactants disclosed in for example Kirk-Othmer Concise Encyclopedia of Chemical Technology, published by John Wiley & Sons, NY, 1985, pages 1142 to 1144 and McCutcheon's Detergents and Emulsifiers, 1981 North American Edition, MC Publishing Company, Glen Rock, N.J. 1981, which are hereby incorporated by reference in their entireties. An example of an anti-corrosion agent useful in the present invention is benzotriazole.

The electronic components are preferably contacted with the activation solution for a contact time to sufficiently deposit the seeding agent on the surfaces of the electronic components to facilitate the electroless deposition of metal. By "contact time," as used herein, it is meant the time an electronic component is exposed to a process liquid. For example, the contact time will include the time an electronic component is exposed to the process liquid during filling a vessel with the process liquid; the time the electronic component is soaked in the process liquid; and the time the electronic component is exposed to the process liquid while the process liquid is being removed from the vessel. The actual contact time chosen will depend on such factors as the seeding agent present in the activation solution, the concentration of the seeding agent, and the temperature of the activation solution. Preferably, the contact time is for an amount of time to deposit less than a monolayer of atoms or molecules of seeding agent (such as palladium) and more preferably from about $10^{12}$ to about $10^{14}$ atoms or molecules of seeding agent per $cm^2$. To accomplish this amount of seeding, preferably the contact time will be from about 1 second to about 60 seconds and more preferably from about 5 seconds to about 30 seconds.

The temperature of the activation solution during contacting is such that the deposition of the seeding agent onto the electronic component can be carried out effectively. Preferably the temperature of the activation solution is less than 60° C. and more preferably from about 15° C. to about 40° C.

The contacting of the electronic components with the activation solution may be carried out in the enclosable single vessel using any technique known to those skilled in the art. For example, the electronic components may be placed in a vessel and the activation solution may be directed through the vessel to fill the vessel full with the solution to achieve contacting. Contacting can be carried out under dynamic conditions (e.g., directing the solution through a vessel containing the electronic components continuously), under static conditions (e.g., soaking the electronic components in the solution) or a combination of both (e.g., directing the solution through the vessel for a period of time, and then allowing the electronic components to soak in the solution for another period of time). In a preferred embodiment of the present invention, the activation solution is fed continuously into the vessel at a flow rate of about 5 gallons per minute (gpm) to about 30 gpm for a time sufficient to pass at least one vessel volume and more preferably from about 2 vessel volumes to about 3 vessel volumes of activation solution through the vessel. Suitable wet processing systems for contacting the electronic components are described in more detail hereinafter.

The contacting of the electronic components with the activation solution is also preferably done in a manner to minimize the amount of exposure of the electronic components to oxygen. The presence of oxygen during the activation step is undesirable because oxygen oxidizes the metallic surface thereby inhibiting the seeding process. Additionally, oxygen can undesirably oxidize the deposited seeds prior to the metal deposition step. Thus, the methods of the present invention minimize the effects of oxygen by contacting the electronic components with the activation solution and metal deposition solution in one vessel that remains closed to the atmosphere during processing with both solutions. Additionally, in a preferred embodiment of the present invention, the activation solution and/or one or more components of the activation solution (such as water) are treated to remove dissolved or suspended oxygen. Preferably, the activation solution is substantially free of oxygen. By "substantially free of oxygen" it is meant that the activation solution contains about 0.25 percent or less, more preferably 0.1 percent or less, and most preferably 0.01 percent or less of the level of dissolved oxygen in the activation solution at saturation (the saturation level of oxygen being determined under the conditions in the vessel during the wet process step). Under typical wet processing temperatures, typically the activation solution contains preferably less than about 50 ppb of dissolved or suspended oxygen, and most preferably oxygen levels as low as possible, based on the total weight of the fluid.

After the electronic components have been contacted with the activation solution for a sufficient period of time, the activation solution is removed from the vessel. The activation solution may be removed from the vessel in any manner known to those skilled in the art. For example, the activation solution may be drained from the vessel and the next desired process liquid may be introduced into the vessel after or during draining of the activation solution. In a preferred embodiment of the present invention, the activation solution is removed by directly displacing the activation solution with the next process liquid desired for contacting the electronic components with. For example, the activation solution could be displaced by a rinsing liquid or a metal deposition solution. Suitable methods for direct displacement are disclosed in for example U.S. Pat. No. 4,778,532, which is hereby incorporated by reference in its entirety.

An advantage to using direct displacement to remove the activation solution is that the electronic components are not exposed to a gas-liquid interface, resulting in reduced particle contamination and/or oxidation of the electronic components. Additionally, direct displacement can be performed in a manner such that the electronics components first exposed to the activation solution are the first electronic components exposed to the next process liquid. This "first in—first out" processing method results in more uniform results since the contact time for all electronic components in a vessel is about the same.

Subsequent to contacting the electronic components with the activation solution, the electronic components are contacted with a metal deposition solution. The metal deposition solution is any liquid containing a source of metal (such as metal ions or compounds containing or forming metal ions). The metal is deposited on the surfaces of the electronic components through the contact of the electronic components with the metal deposition solution. Preferably, the metal deposition solution contains at least one source of metal ions and at least one reducing agent. The reducing agent provides a source of electrons for reducing the metal ions (in the positive oxidation state) to elemental metal (in the zero oxidation state). The source of metal ions may be for example free metal ions, compounds that contain metal ions, or compounds that when dissolved in a liquid form metal ions. The liquid solution in which the source of metal ions is dissolved or dispersed in is preferably water, but may also be or contain an organic solvent such as ethylene glycol, acetic acid, propylene carbonate, or methanol, or combinations thereof.

Examples of sources of metal ions useful in the present invention include metal salts where the metal is in a positive oxidation state. Metal salts include for example salts of copper, nickel, cobalt, gold, silver, palladium, platinum, rhodium, iron, aluminum, tantalum, titanium, tungsten, or combinations thereof. Particularly preferred metal salts include for example copper sulfate, copper chloride, cobalt sulfate, cobalt chloride, nickel sulfate hexahydrate, cobalt chloride hexahydrate, cobalt sulfate heptahydrate, palladium chloride, titanium nitride, tantalum nitride, tungsten nitride, or combinations thereof. One skilled in the art will recognize that there are various other sources of metal ions that can be used in the present invention.

Suitable reducing agents include any compound that is capable of donating electrons in the metal deposition solution. Examples of reducing agents include for example sodium hypophosphite, formaldehyde, borohydrides, amine boranes such as dimethyl amine borane, hydrazine, or combinations thereof Formaldehyde is a particularly preferred reducing agent for the electroless deposition of copper, while sodium hypophosphite, borohydrides, amine boranes or hydrazine are particularly preferred for the electroless deposition of nickel or cobalt.

The metal deposition solution also preferably contains a metal complexant and a pH adjusting additive. The metal complexant is used to keep the source of metal ions soluble at the pH of the metal deposition solution. Thus, a metal complexant may not be necessary if the pH of the metal deposition solution is such that the source of metal ions is soluble. Suitable metal complexants include for example compounds containing metal complexing groups such as tartrates, citrates such as sodium citrate, lactic acid, succinates such as sodium succinate, ammonia, EDTA or combinations thereof. The pH adjusting additive is used to adjust the pH of the metal deposition solution to a pH where the reducing agent will optimally yield electrons. Suitable pH adjusting agents include for example sodium hydroxide, ammonium hydroxide, hydrochloric acid, acetic acid, or combinations thereof. The metal deposition solution may also contain other additives such as anti-corrosion agents; additives that reduce hydrogen gas formation during deposition, such as surfactants (previously described) or activators (e.g., Pd); or combinations thereof One of ordinary skill in the art will recognize that there are various metal complexants, pH adjusting additives, and other additives that can be present in the metal deposition solution. The selection of such additives will depend on such factors as the metal being deposited, the surface composition of the electronic component, and the processing conditions.

The concentration of the metal ion source, the reducing agent, the metal complexant, the pH adjusting additive, and other additives in the metal deposition solution will depend on such factors as the metal being deposited, the metal ion source selected, the desired rate of deposition, and processing conditions such as the temperature of the metal deposition solution and contact time. Preferably, the concentration of the metal ions in the metal deposition solution will be at least about 0.005 M, and more preferably from about 0.005 M to about 0.7 M. The concentration of the reducing agent in metal deposition solution will preferably at least about 0.005 M, more preferably from about 0.005 M to about 10 M, and most preferably from about 0.5 M to about 5 M. Some examples of compositions of preferred metal deposition solutions are shown below in Table II. See also for example, C. H. Ting et al., *Selective Electroless Metal Deposition for via Hole Filling in VLSI Multilevel Interconnection Structures,* J. Electrochem. Soc., Vol. 136, No. 2, February 1989, pp. 462–466. The compositions in Table II are provided as examples only and one of ordinary skill in the art will recognize that various concentrations of metal deposition solutions can be used.

TABLE II

Examples of Compositions of Metal Deposition Solutions

| Metal Deposited | Metal Ion Source | Reducing Agent | Metal Complexant | pH Adjusting Additive |
|---|---|---|---|---|
| Cu | about 0.005 M to about 0.05 M $CuSO_4$ | about 0.5 M to about 5 M HCHO | about 0.01 M to about 0.15 M disodium tartrate | NaOH to adjust pH to about 10.5 to about 12.5 |
| Ni | about 20.0 g/l to about 60.0 g/l $NiSO_4 6H_2O$ | about 0.5 g/l to about 4.0 g/l dimethyl amine borane | about 5.0 g/l to about 35.0 g/l sodium citrate | $NH_4OH$ to adjust the pH from about 5 to 7 |
| Co | about 5.0 g/l to about 30.0 g/l $CoSO_4 7H_2O$ | about 1.0 g/l to about 8.0 g/l dimethyl amine borane | about 15.0 g/l to about 65.0 g/l sodium succinate ($6H_2O$) | $NH_4OH$ to adjust the pH from about 4.5 to 7.5 |
| CoWP | about 5.0 g/l to about 60.0 g/l $CoCl_2 6H_2O$ and about 1.0 g/l to about 20.0 g/l $(NH_4)_2WO_4$ | about 5.0 g/l to about 40.0 g/l $Na_2H_2PO_2$ | about 40.0 g/l to 120.0 g/l of $Na_3C_6H_4O_7 2H_2O$ | trimethyl ammonium hydroxide and KOH to adjust pH to 9 to 9.6 |

In a preferred embodiment of the present invention, where it is desired to deposit copper electrolessly, preferably the metal deposition solution contains about 0.014 M $CuSO_4$ (metal ion source); about 0.079 M disodium tartrate (metal complexant); about 1.8 M formaldehyde (reducing agent) and enough NaOH to adjust the pH to about 11.3.

It has been found in the present invention, that it is preferable to deposit the metal at a slow deposition rate (e.g., less than about 1 nm per minute of metal). It is preferable to have a slow deposition rate of metal so that the deposition of the metal is more selective and deposits preferably on the metal seeded surface, as opposed to other surfaces such as an oxidized electronic component surface or vessel walls. Also, a slow deposition rate is desirable to minimize the formation of hydrogen gas during the reduction of reducing agents such as formaldehyde. Factors that effect the metal deposition rate include the concentration of metal ions and reducing agent in the metal deposition solution, the amount of dissolved or suspended oxygen in the metal deposition solution, the pH of the metal deposition solution, and the temperature of the metal deposition solution. For example, the metal deposition rate is reduced by decreasing the concentration of metal ions and reducing agent, increasing the concentration of dissolved or suspended oxygen in the metal deposition solution, and decreasing the temperature of the solution. The effect of pH on the metal deposition rate will depend on the metal being deposited.

The dissolved or suspended oxygen in the metal deposition solution is preferably maintained at a concentration that is at least about 0.25%, more preferably from about 0.25% to about 25%, and most preferably from about 2.5% to about 9% of the dissolved oxygen level in the metal deposition solution at saturation (where the saturation level of oxygen is determined at the conditions of the metal deposition solution in the vessel). For typical wet processing conditions, preferably the concentration of oxygen in the metal deposition solution will range from about 50 ppb to about 5 ppm, and more preferably from about 0.5 ppm to about 1.7 ppm. As discussed previously, by having the oxygen at such levels, the metal deposition will proceed at a slower rate. Additionally, the presence of oxygen can also enhance the stability of the metal ion source in the metal deposition solution, for example, to prevent degradation.

The electronic components are preferably contacted with the metal deposition solution for a contact time sufficient to deposit a metal layer having a thickness of at least about 5 nm and more preferably from about 20 nm to about 50 nm. The actual contact time chosen will depend on such factors as the concentrations of the metal ion source, reducing agent, and dissolved or suspended oxygen in the metal deposition solution, and the pH and temperature of the metal deposition solution. Preferably, the contact time will be for at least about 1 minute, and more preferably from about 2 minutes to about 60 minutes.

The temperature of the metal deposition solution during contacting is such that the metal deposition is controlled, and a slow deposition rate is achieved (e.g., preferably about 1 nm per minute or less). Preferably, the temperature of the metal deposition solution is less than about 35° C., more preferably from about 15° C. to about 30° C., and most preferably from about 20° C. to about 30° C.

The contacting of the electronic components with the metal deposition solution may be carried out by any wet processing technique previously described for contacting the electronic components with the activation solution. For example, the metal deposition solution may be directed through the vessel to fill the vessel full with the solution to achieve contacting. Additionally, contacting can be carried out under dynamic conditions, under static conditions, or a combination of both. In a preferred embodiment, contacting is carried out by filling the vessel full with the metal deposition solution and soaking the electronic components in the metal deposition solution for a desired soak time. Following soaking, the metal deposition solution can be removed from the vessel using any of the techniques previously described herein. In a preferred embodiment, the metal deposition solution is removed from the vessel by directly displacing the metal deposition solution with another solution, such as a rinsing liquid.

In a preferred embodiment of the present invention, at least for a portion of the contact time with the metal deposition solution, the electronic components are exposed to sonic energy at frequencies that are approximately 18 kHz and greater, and more preferably from about 20 kHz to about 2 MHz. By introducing sonic energy, during contacting, more uniform deposition results can be achieved through increased agitation, removing unwanted particles, and/or dislodging gas bubbles that can adversely affect the deposition process. Sonic energy is especially preferred during contacting under static conditions (e.g., soaking) to provide agitation for overcoming mass transfer limitations. In a preferred embodiment of the present invention, the electronic components are exposed to sonic energy in the range of from about 600 KHz to about 2 MHz, and more preferably from about 600 kHz to about 1.2 MHz. This "high frequency" sonic energy range is commonly referred to as "megasonics." Preferably the sonic energy remains on for at least 50% of the contact time, more preferably at least 80 percent of the contact time and most preferably at least 95% of the contact time.

The sonic energy may be produced according to any technique known to those skilled in the art. For example, sonic energy may be produced and transmitted through a transducer made of piezoelectric material, which becomes electrically polarized when mechanically stressed and will mechanically deform when electrically polarized. See for example, Gale et al., *Experimental Study of Ultrasonic and Megasonic Particle Removal*, Precision Cleaning, Vol. II, No. 4, April 1994 ("Gale Article").

After metal has been deposited on the electronic components, preferably any fluids contacted with the electronic components after contacting the electronic components with the metal deposition solution, are substantially free of oxygen. Preferably, such fluids will typically contain less than about 50 ppb, and most preferably levels as low as possible of dissolved or suspended oxygen based on the total weight of the fluid. By having low levels of dissolved or suspended oxygen in these fluids, the risk of oxidizing the metal on the surfaces of the electronic components is significantly reduced.

In addition to contacting the electronic components with the activation solution and the metal deposition solution, the electronic components may be contacted with any number of other chemical treatment fluids (e.g., gas, liquid, vapor or any combination thereof) to achieve the desired result. By "chemical treatment fluid" or "chemical treatment liquid" it is meant any liquid or fluid that reacts in some manner with the surfaces of the electronic components to alter the surface composition of the electronic component. For example, the chemical treatment liquid or fluid may have activity in removing contamination adhered or chemically bound to the surfaces of the electronic components, such as particulate, metallic, photoresist, or organic materials, or activity in etching the surfaces of the electronic component, or activity in growing an oxide layer on the surface of the electronic component. Thus, the electronic components may be contacted with for example chemical treatment fluids used to etch (hereinafter referred to as etching fluids), grow an oxide layer (hereinafter referred to as oxide growing fluids), to remove photoresist (hereinafter referred to as photoresist removal fluids), to enhance cleaning (hereinafter referred to as cleaning fluids), or combinations thereof. The electronic components may also be rinsed with a rinsing fluid at any time during the wet processing method. Preferably, the chemical treatment fluids and rinsing fluids are liquids.

The chemical treatment fluids useful in the present invention contain one or more chemically reactive agents to achieve the desired surface treatment. Preferably, the concentration of such chemically reactive agents will be greater than 1000 ppm and more preferably greater than 10,000 ppm, based on the weight of the chemical treatment fluid. It is also possible for the chemical treatment fluid to contain 100% of one or more chemically reactive agents. For example, cleaning fluids typically contain one or more corrosive agent such as an acid or base. Suitable acids for cleaning include for example sulfuric acid, hydrochloric acid, nitric acid, or aqua regia. Suitable bases include for example, ammonium hydroxide. The desired concentration of the corrosive agent in the cleaning fluid will depend upon the particular corrosive agent chosen and the desired amount of cleaning. These corrosive agents may also be used with oxidizing agents such as ozone or hydrogen peroxide. Preferred cleaning solutions are "SC1" solutions containing water, ammonia, and hydrogen peroxide, and "SC2" solutions containing water, hydrogen peroxide, and hydrochloric acid. Typical concentrations for SC1 solutions range from about 5:1:1 to about 200:1:1 parts by volume $H_2O:H_2O_2:NH_4OH$. Typical concentrations for SC2 solutions range from about 5:1:1 to about 1000:0:1 parts by volume $H_2O:H_2O_2:HCl$.

In addition to cleaning fluids, it may also be desired to contact the electronic components with solvents such as acetone, isopropanol, N-methyl pyrrolidone, or combinations thereof. Such solvents are chemically reactive agents used, for example, to remove organics or to provide other cleaning benefits.

Suitable etching fluids useful in the present invention contain agents that are capable of removing oxides. Common etching agents useful in the present invention are for example hydrofluoric acid, buffered hydrofluoric acid, ammonium fluoride, or other substances which generate hydrofluoric acid in solution. A hydrofluoric acid containing etching solution may contain for example from about 4:1 to about 1000:1 parts by volume $H_2O:HF$.

Photoresist removal fluids useful in the present invention include for example solutions containing sulfuric acid, and an oxidizing substance such as hydrogen peroxide, ozone or combinations thereof.

One skilled in the art will recognize that there are various process fluids that can be used during wet processing. Other examples of process fluids that can be used during wet processing are disclosed in "Chemical Etching" by Werner Kern et al., in *Thin Film Processes,* edited by John L. Vosser et al., published by Academic Press, NY 1978, pages 401–496, which is incorporated by reference in its entirety.

In addition to contacting the electronic components with chemical treatment fluids, the electronic components may also be contacted with rinsing fluids. Rinsing fluids are used to remove from the electronic components and/or vessel residual chemical treatment fluids, reaction by-products, and/or particles or other contaminants freed or loosened by a chemical treatment step. The rinsing fluids may also be used to prevent redeposition of loosened particles or contaminants onto the electronic components or vessel. Preferably, the temperature of the rinsing fluid is less than 60° C., more preferably from about 20° C. to about 60° C., and most preferably from about 20° C. to about 40° C.

Any rinsing fluid may be chosen that is effective in achieving the effects described above. In selecting a rinsing fluid, such factors as the nature of the surfaces of the electronic components to be rinsed, the nature of contaminants dissolved in the chemical treatment fluid, and the nature of the chemical treatment fluid to be rinsed should be considered. Also, the proposed rinsing fluid should be compatible (i.e., relatively nonreactive) with the materials of construction in contact with the fluid. Rinsing fluids which may be used include for example water, organic solvents, mixtures of organic solvents, ozonated water, or combinations thereof. Preferred organic solvents include those organic compounds useful as drying solutions disclosed hereinafter such as $C_1$ to $C_{10}$ alcohols, and preferably $C_1$ to $C_6$ alcohols. Preferably the rinsing fluid is a liquid and more preferably is deionized water.

Rinsing fluids may also optionally contain low levels of chemically reactive agents to enhance rinsing. For example, the rinsing fluid may be a dilute aqueous solution of hydrochloric acid or acetic acid to prevent, for example, metallic deposition on the surface of the electronic component. Surfactants, anti-corrosion agents, and/or ozone are other additives used in rinsing fluids. The concentration of such additives in the rinsing fluid is minute. For example, the concentration is preferably not greater than about 1000 ppm by weight and more preferably not greater than 100 ppm by weight based on the total weight of the rinsing fluid. In the case of ozone, preferably the concentration in the rinsing fluid is 5 ppm or less.

One skilled in the art will recognize that the selection of chemical treatment fluids and the sequence of chemical treatment fluids and rinsing fluids will depend upon the desired wet processing results. For example, the electronic components could be contacted with a rinsing fluid before or after one or more chemical treatment steps. Alternatively, it may be desired in some wet processing methods to have one chemical treatment step directly follow another chemical treatment step, without contacting the electronic components with a rinsing fluid between two chemical treatment steps (i.e., no intervening rinse). Such sequential wet processing, with no intervening rinse, is described in for example PCT Application WO98/03273, published Jan. 29, 1998, which is hereby incorporated by reference in its entirety.

In one embodiment of the present invention the electronic components may be contacted with any number of chemical treatment fluids and/or rinsing fluids prior to contact with the activation solution. Such treatment may be necessary to remove contaminants or other materials that may interfere with the electroless metal deposition. For example, it may be desired to contact the electronic components with a photoresist removal solution, a cleaning solution, and/or an etching solution prior to contact with the activation solution. In a preferred embodiment of the present invention, the electronic components are treated to remove any native oxides that may be present on the surfaces of the electronic components. To remove native oxides, preferably, the electronic components are contacted with an etching solution such as a hydrofluoric acid containing solution or In another embodiment of the present invention it may be desired to contact the vessel with a cleaning solution, such as a solution containing hydrochloric acid or a base, either before or after loading the electronic components in the vessel, but before contact of the electronic components with the activation solution. Contact with a solution containing hydrochloric acid or a base is preferred to remove residual seeding agent that may have deposited on the walls of the vessel in a previous batch of electronic components. A solution of hydrochloric acid is particularly preferred for removing residual palladium from the vessel. If the surfaces of the electronic components are not adversely affected by the cleaning solution, the electronic components may be present in the vessel during contact with the cleaning solution. If the electronic components are adversely affected by the cleaning solution, then the cleaning solution is preferably used to rinse the vessel prior to loading the electronic components in the vessel.

In another embodiment of the present invention, if the surfaces of the electronic components are already free of contaminants and native oxides, it may be desirable, prior to contacting the electronic components with the activation solution, to contact the electronic components with a rinsing fluid such as deionized water to wet the surfaces of the electronic components. Preferably, in such a wet processing step, the rinsing fluid is at a temperature of from about 20° C. to about 60° C. and more preferably from about 20° C. to about 40° C.

In another embodiment of the present invention, it may be desired to contact the electronic components with a rinsing fluid after contacting the electronic components with the activation solution, but before contacting the electronic components with the metal deposition solution. The rinsing fluid in this embodiment is preferably deionized water at a temperature of from about 20° C. to about 60° C. The electronic components are preferably contacted with the rinsing fluid for a contact time sufficient to remove residual chemicals, and/or reaction by-products produced during activation. In this embodiment, preferably the rinsing fluid is substantially free of oxygen. It is also possible, as previously described, to contact the electronic components with the activation solution, directly followed by contacting the electronic components with the metal deposition solution with no intervening rinse between these two chemical treatment steps.

Following contact of the electronic components with the metal deposition solution, it is preferred in the present invention, that the electronic components are contacted with a rinsing fluid of deionized water having a temperature of from about 20° C. to about 60° C. This rinsing step is preferably carried out to remove residual chemicals, and/or reaction-by products remaining in the vessel or on the surfaces of the electronic components after contacting the electronic components with the metal deposition solution. The rinsing fluid is preferably substantially free of oxygen to minimize the risk of oxidation of the deposited metal.

Thus, there are various types of ways in which the electronic components can be wet processed in accordance with the method of the present invention. For example, wet processing can be carried out using sonic energy (such as in the megasonic energy range) during the contacting of the electronic components with a process liquid to enhance cleaning or for more uniform metal deposition. Such methods may include wet processing techniques disclosed in for example U.S. Pat. No. 5,383,484; PCT Application Nos. WO98/03273, published Jan. 29, 1998; and WO99/30355, published Jun. 17, 1999; U.S. patent application Ser. No. 09/253,157, filed Feb. 19, 1999; and Ser. No. 09/257,488, filed Feb. 25, 1999; and Ser. No. 09/324,813, filed Jun. 2, 1999; and U.S. Provisional Patent Application Ser. No. 60/111,350 filed Dec. 8, 1998 and U.S. Provisional Patent Application Ser. No. 60/114,757 filed Jan. 5, 1999, the disclosures of which are all hereby incorporated by reference in their entireties.

Following the last wet processing step in the vessel, it is preferable that the electronic components be dried. By "dry" or "drying" it is meant that the electronic components are preferably made substantially free of liquid droplets. By removing liquid droplets during drying, impurities present in the liquid droplets do not remain on the surfaces of the electronic components when the liquid droplets evaporate. Such impurities undesirably leave marks (e.g., watermarks) or other residues on the surfaces of the electronic components. However, it is also contemplated that drying may simply involve removing a treating, or rinsing fluid, for example with the aid of a drying fluid stream, or by other means known to those skilled in the art.

Any method or system of drying may be used. Suitable methods of drying include for example evaporation, centrifugal force in a spin-rinser-dryer, steam or chemical drying, or combinations thereof.

A preferred method of drying uses a drying fluid stream to directly displace the last processing solution that the electronic components are contacted with in the vessel prior to drying (hereinafter referred to as "direct displace drying"). Suitable methods and systems for direct displace drying are disclosed in for example U.S. Pat. Nos. 4,778,532, 4,795,497, 4,911,761, 4,984,597, 5,571,337, and 5,569,330. Other direct displace dryers that can be used include Marangoni type dryers supplied by manufacturers such as Steag, Dainippon, and YieldUp. Most preferably, the system and method of U.S. Pat. No. 4,7911,761 is used for drying the electronic components.

Preferably, the drying fluid stream is formed from a partially or completely vaporized drying solution. The drying fluid stream may be for example superheated, a mixture of vapor and liquid, saturated vapor, or a mixture of vapor and a noncondensible gas.

The drying solution chosen to form the drying fluid stream is preferably miscible with the last process fluid in the vessel and non-reactive with the surfaces of the electronic components. The drying solution also preferably has a relatively low boiling point to facilitate drying. For example, the drying solution is preferably selected from organic compounds having a boiling point of less than about 140 degrees centigrade at atmospheric pressure. Examples of drying solutions which may be employed are steam, alcohols such as methanol, ethanol, 1-propanol, isopropanol, n-butanol, secbutanol, tertbutanol, or tert-amyl alcohol, acetone, acetonitrile, hexafluoroacetone, nitromethane, acetic acid, propionic acid, ethylene glycol mono-methyl ether, difluoroethane, ethyl acetate, isopropyl acetate, 1,1,2-trichloro-1,2,2-trifluoroethane, 1,2-dichloroethane, trichloroethane, perfluoro-2-butyltetrahydrofuran, perfluoro-1,4-dimethylcyclohexane or combinations thereof. Preferably, the drying solution is a $C_1$ to $C_6$ alcohol, such as for example methanol, ethanol, 1-propanol, isopropanol, n-butanol, secbutanol, tertbutanol, tert-amyl alcohol, pentanol, hexanol or combinations thereof.

In a preferred embodiment of the present invention a drying solution is selected which is miscible with the processing solution present in the process vessel immediately before drying and forms a minimum-boiling azeotrope with the processing solution. Since water is the most convenient and commonly used solvent for chemical treatment or rinsing fluids, a drying solution which forms a minimum-boiling azeotrope with water is especially preferred.

The methods of the invention are carried out in a single enclosable vessel system. In a preferred embodiment of the invention, the electronic components are housed in a single vessel system such as those disclosed in U.S. Pat. Nos. 4,778,532, 4,917,123, 4,911,761, 4,795,497, 4,899,767, 4,984,597, 4,633,893, 4,917,123, 4,738,272, 4,577,650, 5,571,337 and 5,569,330, the disclosures of which are herein incorporated by reference in their entirety. Preferred commercially available single vessel systems are Full-Flow™ vessels such as those manufactured by CFM Technologies, Inc., Poseidon manufactured by Steag, and FL820L manufactured by Dainippon Screen. Such systems are preferred because the oxygen levels can be more readily controlled. Additionally, such systems are designed so that wet processing and drying can be performed in the same vessel, leading to reduced risk of oxidation and contamination of the electronic components.

The enclosable single vessel system useful in the present invention is preferably capable of receiving different process fluids in various sequences. A preferred method of delivering process fluids to the vessel is by direct displacement of one fluid with another. The Full Flow™ wet processing system manufactured by CFM Technologies, Inc. is an example of a system capable of delivering fluids by direct displacement.

In another preferred embodiment of the present invention, the enclosable single system is capable of forming the process liquids such as the activation solution and metal deposition solution in-line, prior to entering the vessel. This "point of use mixing" has many advantages. For example, by forming the activation and metal deposition solutions in-line, undesired side reactions are minimized and degradation of the activation and metal deposition solutions are less likely. For example, in a typical copper metal deposition solution, the solubility of oxygen is dependent on the concentration of $HCOO^-$ (formate ions). As the lifetime of the metal deposition solution increases, the concentration of formate ions increases leading to changes in the solubility of oxygen. As previously described herein, a change in the oxygen level in the metal deposition solution affects the metal deposition rate. Therefore, to keep the metal deposition rate constant, the metal deposition solution is preferably kept as fresh as possible by point of use mixing. Additionally, auto-plating of the activation and metal deposition solutions in storage containers can be avoided, and the risk of auto-plating occurring in the vessel is also reduced by point of use mixing. Thus, point of use mixing can provide more consistent concentrations of reactants in the activation and metal deposition solution resulting in reduced variability within a batch and between batches.

The combination of using the activation and metal deposition solutions one time as previously described herein, and forming the solutions in-line, prior to entering the vessel can further improve processing results. For example, solution concentrations can be more consistently maintained at all times, leading to the avoidance of batch to batch nonuniformity of the deposited metal layer thickness.

In-line formation (i.e., point of use mixing) of the activation solution and metal deposition solution can be performed in various ways. For example, it may be desired to premix or purchase certain solutions in concentrated form that are stable, and store them prior to use. One or more of the stored solutions can then be fed as separate streams into the system and combined with deionized water. The resulting stream is then fed into the vessel for contact with the electronic components. The stored solutions may contain for example one reagent or a mixture of reagents that have storage stability when combined together. Preferably the stored solutions are in concentrated form so that less storage space is needed.

With respect to the activation solution, the seeding agent and other components present in the activation solution may each be stored separately and combined together with deionized water in-line to form the activation solution. Alternatively, the seeding agent and one or more, or all of the other components in the activation solution, such as hydrofluoric acid, acetic acid, and hydrochloric acid may be stored as one concentrated solution (as long as the stored solution has storage stability), and combined in-line with deionized water and any other desired solution prior to being fed into the vessel.

With respect to the metal deposition solution, it is preferred for storage stability that a solution containing the source of metal ions (such as a metal salt) and a solution containing the reducing agent be stored separately and combined in-line with deionized water. Also, it is preferred that the metal complexant (if present) be stored separately, or with the solution containing the source of metal ions. The metal complexant could also be stored with the solution containing the reducing agent. Preferably, the pH adjusting additive is stored separately, or with either the solution containing the source of metal ions, the solution containing the reducing agent, or both.

A preferred enclosable single vessel system useful in the methods of the present invention that is capable of, for example, directly displacing one process liquid with another process liquid, and forming process liquids in-line is shown in the FIGURE. The FIGURE shows an enclosable single vessel system 10 useful in the methods of the present invention. The single vessel system 10 includes the following: a vessel module 2, a drying fluid module 50 for supplying a drying fluid stream 64 to vessel module 2, a pumping module 52 for pumping process fluid from and to vessel module 2, an injection module 54, a deionized water mix module 56, and a gas control unit 58 for controlling the level of gases in the deionized water.

The vessel module 2 contains a process vessel 20 having a support (not shown) for holding wafers 22, and top and bottom fluid ports 24, 26 respectively. The deionized water mix module provides a stream of deionized water 30 that can optionally be further subdivided into deionized water streams 30A, 30B, 30C, and 30D.

The injection module 54 supplies one or more chemical streams 32A, 32B, 32C, and 32D to the vessel module 2. Prior to being introduced to the process vessel 20, one or more chemical streams 32A, 32B, 32C, and 32D may optionally be combined at mixing valves 36A through 36D with deionized water streams 30A, 30B, 30C, and 30D respectively. The resulting one or more diluted chemical streams may then be directed into the process vessel 20 via valve 17 as process fluid stream 38. As shown in the FIGURE, process fluid stream 38 may contain deionized water alone, one or more chemicals, or a mixture of deionized water and one or more chemicals. Thus, such an injection module 54 can provide point of use mixing as previously described herein.

Another feature shown in the FIGURE is that to allow time for the concentration of chemicals in process fluid stream 38 to stabilize, the process fluid stream 38 maybe directed to drain 98 via drain line 96 with bleed valve 18 open and valve 17 closed.

Process fluid stream 38 preferably enters process vessel 20 via line 25, through bottom fluid port 26, contacts wafers 22, and then exits top fluid port 24 via line 23. It is also possible to feed the process fluid stream 38 from top to bottom. Depending on the desired treatment, the process fluid exiting top fluid port 24 may then be directed to line 95, drain line 96 and drain 98 with valve 16 open and valve 12 closed. Pumping module 52 can be used for flushing deionized water 30 through the system lines via streams 53 and 55.

Gas control unit 58 is used to control the level of gases such as oxygen in the deionized water prior to being delivered to process vessel 20. In a preferred embodiment, the gas control unit uses a Liqui-Cel® gas-liquid contactor manufactured by the Separation Products Group of Hoechst Celanese Corporation, Charlotte, N.C. Preferably, the gas control unit has the capacity to pull and maintain a vacuum in a controlled fashion, add additional gases in a controlled fashion, and can handle process liquids having various flow rates. Further detail on suitable gas control units, and the operation of such units is disclosed in for example U.S. application Ser. No. 09/253,157, filed Feb. 19, 1999, the disclosure of which is hereby incorporated by reference in its entirety.

The drying fluid module 50 supplies a drying fluid stream 64 to process vessel 20 via valves 65 and 12 (with valve 16 closed). Thus drying fluid stream 64 is preferably fed to the process vessel 20 from top fluid port 24. Drying can be accomplished with the process vessel initially full of process fluid by directing the drying fluid stream 64, through valve 65 and valve 12 through top fluid port 24 and into process vessel 20. As the drying fluid stream displaces the process fluid, the drying fluid stream preferably mixes with the process fluid and forms a distinctive drying fluid layer (not shown) on top of the process fluid. The process fluid and drying fluid layer exits process vessel 20 through line 25 and is then directed through valves 14, 78, 79, and 81. A drain pump 80 may optionally be used to allow better control of the descent rate of the process fluid and drying fluid stream to optimize drying. Valve 82 is used to either direct the process fluid/drying fluid stream to a drying fluid recovery system (not shown) via line 83, or to drain 98 via line 85.

Following drying, the electronic components may be removed from the vessel and further processed in any desired manner.

Although the present invention has been described above with respect to particular preferred embodiments, it will be apparent to those skilled in the art that numerous modifications and variations can be made to those designs. The descriptions provided are for illustrative purposes and are not intended to limit the invention.

What is claimed is:

1. A method of electrolessly depositing a metal onto an electronic component comprising:
   (a) loading a plurality of electronic components in an enclosable single vessel;
   (b) forming an activation solution comprising at least one seeding agent, wherein the activation solution is substantially free of oxygen;
   (c) feeding the activation solution into the vessel, contacting the electronic components in the vessel with the activation solution for a first contact time, and removing the activation solution from the vessel, wherein the activation solution is contacted with the electronic components a single time, without reuse of the activation solution;
   (d) forming a metal deposition solution comprising at least one source of metal ions, at least one reducing agent, and oxygen;
   (e) feeding the metal deposition solution into the vessel and contacting the electronic components in the vessel with the metal deposition solution for a second contact time to deposit metal onto the surfaces of the electronic components, wherein the metal deposition solution is contacted with the electronic components a single time, without reuse of the metal deposition solution;
   (f) exposing the electronic components to sonic energy for at least a portion of the second contact time; and
   (g) removing the metal deposition solution from the vessel.

2. The method of claim 1 wherein the activation solution or the metal deposition solution, or both are formed in-line by combining at least one stream of a concentrated stored solution with a stream of deionized water to form a stream of the activation solution or the metal deposition solution that is fed into the vessel.

3. The method of claim 1 wherein the metal deposition solution is formed in-line by combining at least a stream comprising the source of metal ions, a stream comprising the reducing agent, and a stream of deionized water to form a stream of the metal deposition solution that is fed into the vessel.

4. The method of claim 3 wherein the metal deposition solution stream further comprises at least one pH adjusting additive and at least one metal complexant.

5. The method of claim 4 wherein the metal complexant and pH adjusting additive is present in the stream comprising the source of metal ions or is combined separately with the stream comprising the source of metal ions and the stream comprising the reducing agent.

6. The method of claim 1 wherein the source of metal ions provides metal ions selected from the group consisting of copper, cobalt, nickel, gold and combinations thereof.

7. The method of claim 6 wherein the metal ions are copper ions.

8. The method of claim 1 wherein the seeding agent contains at least one compound, element or ion of palladium or combinations thereof.

9. The method of claim 1 wherein the activation solution or the metal deposition solution, or both are removed from the vessel by direct displacement with another process liquid.

10. The method of claim 9 wherein the activation solution is directly displaced by the metal deposition solution.

11. The method of claim 9 wherein the activation solution is directly displaced by a rinsing liquid and the rinsing liquid is directly displaced by the metal deposition solution.

12. The method of claim 1 further comprising contacting the electronic components with a rinsing solution after contacting the electronic components with the activation solution and prior to contacting the electronic components with the metal deposition solution.

13. The method of claim 1 further comprising the step of rinsing the electronic components during or after the removal of the metal deposition solution from the vessel.

14. The method of claim 1 further comprising the step of drying the electronic components in the vessel using a drying fluid stream.

15. The method of claim 1 wherein the electronic components are semiconductor wafers and are spaced in the vessel from about ½ pitch to about ¼ pitch.

16. The method of claim 1 further comprising the step of feeding hydrochloric acid into the vessel and removing the hydrochloric acid from the vessel before contacting the electronic components with the activation solution.

17. The method of claim 1 further comprising the step of contacting the electronic components with a solution that removes oxide from the surfaces of the electronic components prior to contacting the electronic components with the activation solution.

18. The method of claim 1 wherein the contacting of the electronic components with the metal deposition solution comprises filling the vessel with the metal deposition solution, soaking the electronic components in the metal deposition solution in presence of megasonic energy, and removing the metal deposition solution from the vessel following soaking.

19. The method of claim 1 wherein the contacting of the electronic components with the activation solution comprises passing at least one vessel volume of the activation solution through the vessel and removing the activation solution through direct displacement with another process liquid.

20. The method of claim 1 wherein the oxygen is maintained at a level in the metal deposition solution ranging from about 50 ppb to about 5 ppm.

* * * * *